United States Patent [19]
Ono et al.

[11] Patent Number: 5,483,684
[45] Date of Patent: Jan. 9, 1996

[54] AUTOMATIC FREQUENCY SEARCH AND STORAGE METHOD

[75] Inventors: Akira Ono, Dallas, Tex.; Tateo Masaki, Sakura, Japan

[73] Assignees: Uniden America Corporation, Fort Worth, Tex.; Uniden Corporation, Ichikawa, Japan

[21] Appl. No.: 206,058

[22] Filed: Mar. 3, 1994

[51] Int. Cl.⁶ .................................................. H04B 1/06
[52] U.S. Cl. .................................... 455/161.2; 455/168.1; 455/186.1
[58] Field of Search .............................. 455/186.1, 186.2, 455/185.1, 154.1, 158.4, 160.1, 161.1, 161.2, 161.3, 166.1, 168.1, 176.1, 179.1, 180.1

[56] References Cited

U.S. PATENT DOCUMENTS

| | | |
|---|---|---|
| 3,965,336 | 6/1976 | Grohmann . |
| 4,218,773 | 8/1980 | Imamura . |
| 4,236,251 | 11/1980 | Ohgishi et al. ...................... 455/186.1 |
| 4,271,532 | 6/1981 | Wine . |
| 4,355,416 | 10/1982 | Malerba . |
| 4,509,203 | 4/1985 | Yamada . |
| 4,521,915 | 6/1985 | Baker et al. . |
| 4,525,866 | 6/1985 | Templin . |
| 4,688,261 | 8/1987 | Killoway et al. . |
| 4,833,728 | 5/1989 | Kimura et al. ...................... 455/186.1 |
| 4,860,380 | 8/1989 | Mengel . |
| 4,901,036 | 2/1990 | Herold et al. . |
| 4,947,456 | 8/1990 | Atkinson et al. . |
| 5,014,348 | 5/1991 | Boone et al. . |
| 5,163,161 | 11/1992 | Bowles et al. . |
| 5,355,527 | 10/1994 | Owaki ................................ 455/186.2 |

FOREIGN PATENT DOCUMENTS 2073492  2/1992  Japan .

*Primary Examiner*—Andrew I. Faile
*Attorney, Agent, or Firm*—Daniel R. Brown

[57] ABSTRACT

A method of searching a specified band of frequencies for a plurality of active signal frequency in a scanning receiver is disclosed. In the preferred embodiment, a range of channel memory storage locations are specified and a controller in the scanning receiver repetitively scans the range of frequencies for active signal frequencies and stores a number corresponding to each active signal frequency in one of the storage locations. Upon filling all of the specified storage locations, the search and store operation is terminated.

8 Claims, 2 Drawing Sheets

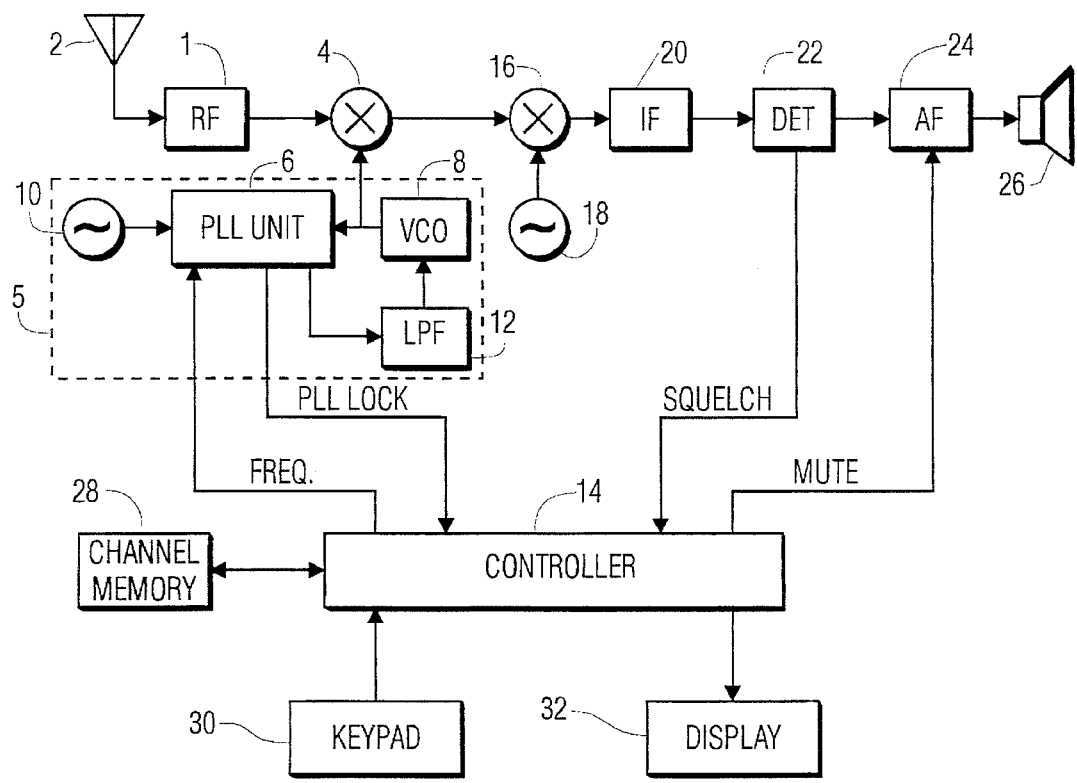
Fig. 1
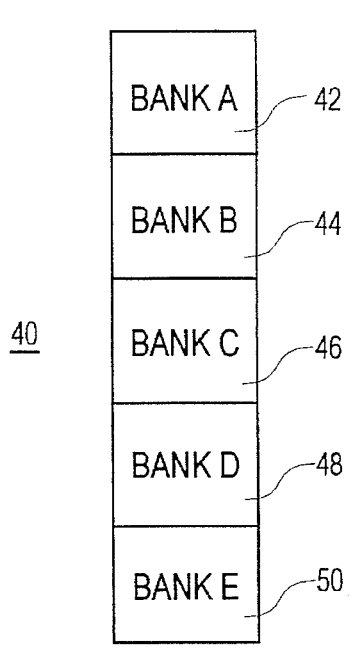
Fig. 2
| CH1 | 153.500 | 51 |
| --- | --- | --- |
| CH2 | 155.015 | 52 |
| CH3 | 161.570 | 53 |
| CH4 | 150.175 | 54 |
| CH5 | 000.000 | 55 |
| CH6 | 144.115 | 56 |
| CH7 | 000.000 | 57 |
| CH8 | 000.000 | 58 |
| CH9 | 000.000 | 59 |
| CH10 | 000.000 | 60 |
Fig. 3

AUTOMATIC FREQUENCY SEARCH AND STORAGE METHOD

TECHNICAL FIELD OF THE INVENTION

This invention relates to scanning radio receivers and more particularly to scanning radio receivers having frequency search and channel memory storage capabilities.

BACKGROUND OF THE INVENTION

Scanning radio receivers are well known in the art and have improved and evolved with the ever higher level of circuit integration available in modern electronic technology.

It is common for a modern scanning radio to comprise a microcontroller or microprocessor with memory and phase-lock-loop frequency synthesizer, so that a great number of frequencies can be received and, if desired, stored in a channel memory. It is common for scanning receivers to comprise two hundred or more storage locations in its channel memory. It is also common for modern scanning receivers to receive a very wide bandwidth of frequencies. Receivers are capable of receiving from 29 MHz to over 1 GHz in channel increments of 5 kHz, 12.5 kHz, and 25 kHz, for example.

A common operational mode for such a scanning receiver is to scan a desired band of frequencies and listen for desired signal transmissions. Upon hearing such a signal, the user can manually program the received frequency into a channel memory, so that the frequency can be subsequently scanned for reception of signal transmissions. A plurality of frequencies may carry related signal transmission and therefore it is desirable to scan a group of frequencies, or channels, in order to receive all of the related signals. For example, the aircraft band comprises the frequencies ranging approximately from 108 MHz to 137 MHz. Various frequencies in this band may or may not carry signals depending of the geographic location and air traffic in that area. Because of this grouping of frequencies, modern scanning receivers have channel memories which group a plurality of channel memory storage locations into banks of storage locations, or channels, which can be selectively scanned. For example, a first bank may be programmed with frequencies in the aircraft band. A second bank may be programmed with frequencies from the 70 cm amateur radio band, etc. When a user desires to scan a particular group of channels, known to carry intermittent signal transmissions, the user merely activates a bank of channel memories which had been previously programmed with the desired group of frequencies.

The task of programming the various frequencies which regularly carry intermittent signals into a channel memory can be a difficult task. Considering, in the foregoing example, that the band of frequencies from 108 MHz to 137 MHz is divided into approximately 2300 discrete frequencies.

To alleviate and simplify this problems, certain publications are available which tabulate the frequencies for various types of services in particular geographic areas. Scanner users can refer to this type of publication to select frequencies and program channels into a scanning receiver, so that the desired channels can be scanned to monitor the desired communications signals. However, the use of such a publication is not an ideal solution nor a particularly convenient method of programming channels into a scanning receiver. Frequently, there are a large number of channels listed for a particular service type, and, many of these channels are essentially idle. If a user programs all of the channels for a particular service type into the scanning receiver, then many of the scanner channel memory storage locations will be filled with channels that have very little chance of carrying desirable signals. Furthermore, when the scanner is scanning the plurality of programmed channels, time will be wasted scanning the aforementioned channels. As such, desired communications signals will not be received during the time the idle channels are scanned. Also, the Federal Communications Commission continually licenses new users in the various bands so that no publication listing frequency allocations can be completely up to date.

Other communications receivers have been devised which scan for the presence of a signal and so note the presence of such signals. Modern television sets, for example, have automatic channel search features which scan all the channels which are receivable by the receiver and record the existence of signals on each of the channels on which they are found. However, such a scheme relies on the fact that a continuous signals is being broadcast at a particular frequency, allowing the automatic channel search feature to find the signal at the moment it receives a particular frequency. In the situation of a broad band scanning receiver, however, most of the transmitted signals are not continuous, but rather intermittent. Therefore, the channel search features as described above will not be suitable.

Clearly, there is a need to simplify the process of programming frequencies from within a given band of frequencies, that carry intermittently transmitted signals, into a channel memory.

SUMMARY OF THE INVENTION

A method of programming active signal frequencies into a channel memory, in a scanning receiver is disclosed which is embodied in software that is executed by a controller in a scanning receiver. In the preferred embodiment, a channel memory comprising a plurality of channel memory storage locations, which is grouped into banks of storage locations, are programmed in a search and store mode of operation. A band of frequencies is selected by specifying a first limit frequency and a second limit frequency and the plurality of frequencies defined by the limit frequencies is repetitively scanned for the presence of active signals. As active signals are found, a number representative of the frequency on which the active signal is found, is stored into an available channel memory storage location.

The scanning receiver in the preferred embodiment has a channel memory having storage locations. A plurality of storage locations is specified by selecting one or more banks of storage locations in the channel memory. As the scanning receiver finds active signal frequencies, a number corresponding to frequency is stored in an available channel memory storage location. When all of the available channel memory storage locations, in the bank or banks previously specified, are full, then the search and store method is terminated.

As each active signal frequency is identified, the channel memory is searched for a number corresponding to the frequency of the presently identified active signal frequency. If such a number is found in the channel memory, then the presently identified active signal frequency is a duplicate of one already programmed into the channel memory, and, therefore, is not stored again. This procedure prevents the specified plurality of channel memory locations from being programmed with duplicate frequencies. And, allows for the programming of a plurality of active signal frequencies into a plurality of channels memory storage locations over a substantially long period of time, thereby increasing the probability that an intermittently transmitted signal will be identified as an active signal frequency by repetitively searching a band of frequencies until such a signal is identified.

BRIEF DESCRIPTION OF THE DRAWINGS

The features of the present invention which are believed to be novel are set forth with particularity in the appended claims. The invention, together with further objects and advantages thereof, may be best understood by making reference to the following description taken in conjunction with the accompanying drawings, in the several figures of which like reference numerals identify identical elements, and wherein:

FIG. 1 is an electrical block diagram of a scanning receiver in the preferred embodiment of the present invention.

FIG. 2 is a memory map of the channel memory in the preferred embodiment.

FIG. 3 is a detailed memory map of a memory bank in the preferred embodiment.

DETAILED DESCRIPTION

Figure 4:
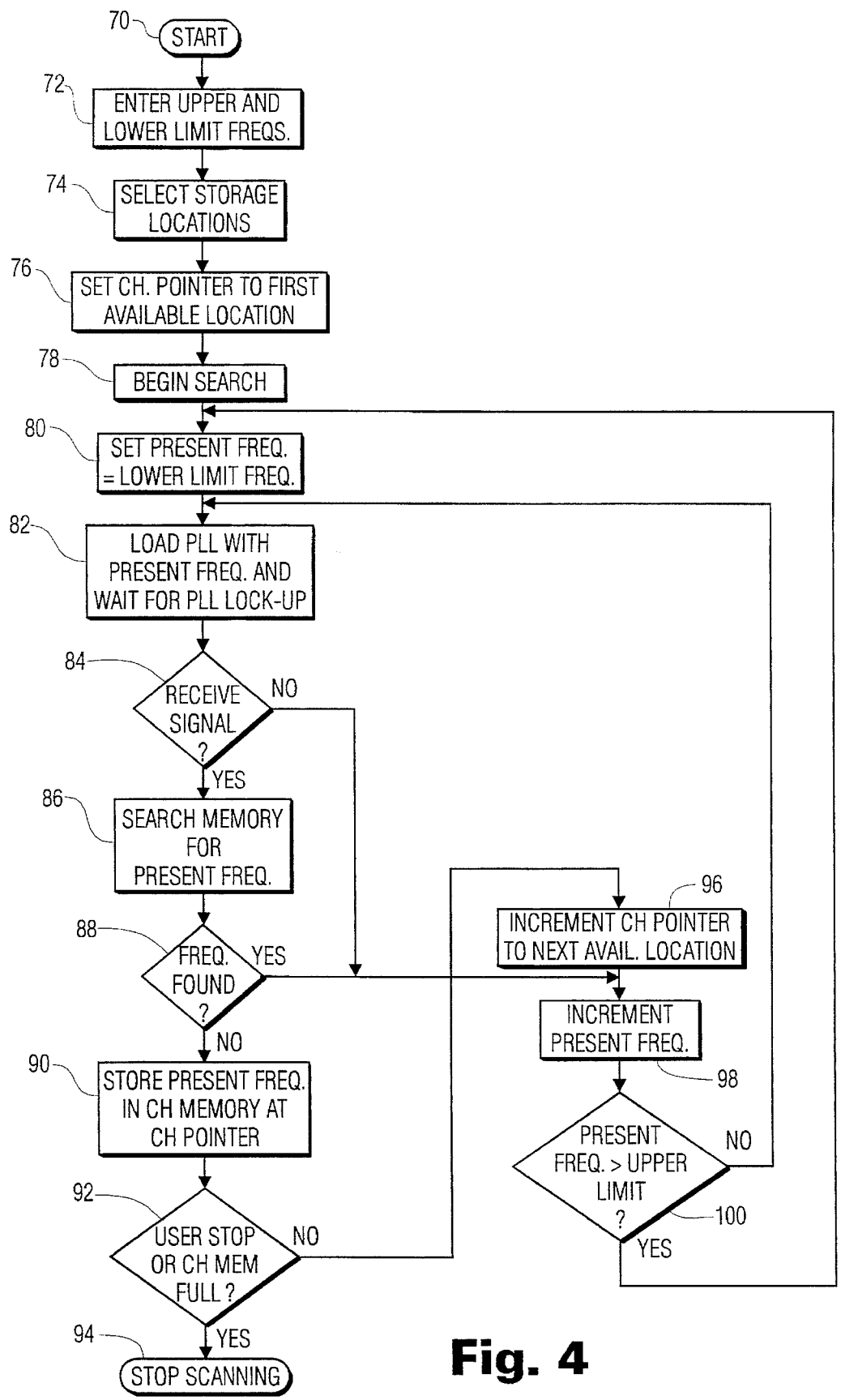
FIG. 4 is a flow diagram of the search and store method in the preferred embodiment.

The present invention is embodied in a broad band scanning receiver. The various steps claimed are executed either by object code software commands, under control of a microcontroller, described later, or by user input commands to the scanning receiver.

Reference is directed to FIG. 1 which is an electrical block diagram of the scanning receiver, or scanner, in the preferred embodiment. The scanner comprises an RF circuit 1 which receives a broad band of RF waves comprising a plurality of RF signals, from time to time, as received by antenna 2. The output of RF circuit 1 is coupled to a first mixer 4. First mixer 4 mixes the signals output from RF circuit 1 with signals coupled from the output of a frequency synthesizer circuit 5 comprising a PLL unit 6, voltage controlled oscillator 8, low pass filter 12, and first oscillator 10. Together these components form a phase lock loop frequency synthesizer 5.

The PLL unit 6 comprises a phase comparator circuit, (not shown), and a divide by counter, (not shown). A FREQ. signal is input to the divide by counter from controller 14, and this signal provides a number which is a divisor for the divide by counter. Varying the quantity of this number causes the PLL unit 6 to vary the signal into the low pass filter 12 which in turn controls the input voltage to the voltage controlled oscillator 8. As such, entering a number into the PLL unit 6 determines the frequency of the signal coupled to mixer 4, and thereby controls the frequency of reception of the entire receiver. At the time the number is output from controller 14 to PLL unit 6, the phase comparator indicates and out of phase condition, or out of lock condition to controller 14 via the PLL LOCK signal. The frequency synthesizer 5, as a unit, slews the VCO 8 to the correct frequency after a brief period of time. As this occurs, the phase comparator indicates the lock up condition to the controller 14 via the PLL LOCK signal.

The output of frequency synthesizer 5 mixes with the output of RF circuit 1 in first mixer 4 to produce a first intermediate frequency at the output of mixer 4. The first intermediate frequency is coupled to the input of second mixer 16. A second local oscillator 18 feeds a second local oscillator frequency into mixer 16 and the first intermediate frequency and second oscillator frequency mix in mixer 16 to produce a second intermediate frequency which is coupled to the input of intermediate frequency circuit 20. The output of intermediate frequency 20 is coupled to the input of detector circuit 22 which produces an audio frequency output that is further coupled to audio frequency circuit 24. Detector circuit 22 also produces a squelch output signal which indicates the presence of an active signal, SQUELCH, to controller 14. Squelch signals are commonly used in the art for various types of receivers including amplitude modulated signal receivers and frequency modulated signals receivers. It is common for the threshold level of the squelch signal to be adjustable by means of a potentiometer, or other similar control. Adjustment of the squelch threshold adjusts the threshold signal strength of an active signal frequency that will be received and stored in the preferred embodiment. Although, other means of determining whether or not an active signal is acceptable or not are certainly feasible.

Audio frequency circuit 24 amplifies the aforementioned audio signal and drives speaker 26. Audio frequency circuit 24 also receives a muting signal, MUTE, from controller 14 which enables and disables the output of audio circuit 24, thereby enabling and disabling the audio signal reproduced by speaker 26.

Controller 14 may comprise an 8-bit central processing unit together with memory, including RAM, ROM, and EEPROM, and peripheral input/output circuitry. The Hitachi model H8/338 is suitable, for example. In FIG. 1, a separate channel memory 28 is shown, however, the channel memory may be a part of the aforementioned memory circuits comprised within the controller 14. In the preferred embodiment, EEPROM is used because of its non-volatile attribute. Channel memory 28 is shown as a separate entity in FIG. 1 for clarity only.

A keypad 30 is coupled to the controller 14 in the preferred embodiment. The keypad serves as an input device for selecting the upper and lower limit frequencies and for enabling the automatic channel search and storage method described herein. The keypad may be of conventional design and include the numeric digits "0" through "9" and a decimal point. Frequencies are entered as multiples of one megahertz. For example 153.500 MHz is entered as "1-5-3-.-5-0-0". The keypad also includes actuators for specifying the first and second limit frequencies, and, an actuator for enabling and disabling the automatic channel search and storage methods. Frequencies are converted by controller 14 into numbers which are used a divisors for the PLL unit 6, as described herein before. The keypad is also used to select banks of storage locations within the channel memory 28. In the preferred embodiment, there are five banks of ten storage locations and the banks are identified by the letters "A" through "E".

A display 32 is coupled to controller 14 for displaying various status information concerning the operation of the scanning receiver. In the preferred embodiment, the display is a custom masked liquid crystal type which comprises seven digits of seven-segment display characters plus a decimal point for displaying the frequency information, and, two additional digits of seven-segment display characters for displaying the channel numbers. Also, the display comprises icons for the letters "A" through "E" for displaying the selection of the channel memory banks. The aforementioned seven-segment digits are also used to display simple words including "SCAN" and "END". Such displays are well known in the art.

Reference is directed to FIG. 2 which is a memory map of the channel memory 40 in the preferred embodiment. The channel memory comprises a plurality of storage locations which are subdivided into memory banks "A" 42, "B" 44, "C" 46, "D" 48, and "E" 50. In the preferred embodiment, each bank comprises ten storage locations. Each bank is selectable from the keypad 30 by depressing a key which is identified by the appropriate bank's letter, "A" through "E".

Reference is directed to FIG. 3 which is a memory map of one bank 42 of the channel memory 28 in the preferred embodiment. The bank 42 comprises a plurality of storage locations 51, 52, 53, 54, 55, 56, 57, 58, 59, 60 each of which is suitable for storing a number corresponding to a receive frequency of the scanner, as described herein before. Each storage location is identified as a channel and is assigned a corresponding channel number. The purpose of channel references is to simplify the operation of the scanner for the user. In the preferred embodiment, the channels are consecutively number, starting from "1" and each bank comprises ten channels. The use of banks is convenient because it allows the user to group various frequencies, or channels, by service type or geographic area. For example, aircraft frequencies could be programmed into banks "A", police frequencies into banks "B", and etc.

FIG. 3 also shows a channel memory pointer 62. The channel memory pointer 62 is implemented in software and identifies the currently selected storage location to which a memory operation may occur. In the preferred embodiment, the channel memory pointer 62 is used to identify a storage location that does not have a number programmed therein. Such a location is identifiable by the presence of all zeros, whereas a storage location with anything but zeros is assumed to be programmed. It is to be understood that the storage locations do not necessarily have to be programmed sequentially.

Reference is directed to FIG. 4 which is a software flow diagram of the frequency search and storage method in the preferred embodiment. The software routine is started at step 70 when the automatic frequency search and storage feature is enabled. At step 72, the user enters upper and lower frequency limits which establish the range of frequencies or band of frequencies that are to be scanned. At step 74 the user selects a plurality of storage location into which the numbers corresponding to frequencies will be stored. In the preferred embodiment, the storage locations are selected on a per bank basis by pressing keys associated with the banks to be selected. Other means for selecting the desired storage locations could be used, such as selecting the storage locations on a channel by channel basis.

At step 76, the controller sets the channel pointer to the first available storage location in the selected plurality of storage locations. This operation is accomplished by starting at the lowest channel number in the lowest bank and testing the contents of the storage location for equality with zero. If equality is not found, then the location is not available and the pointer is incremented to the next location and the test is repeated. If, after any test, equality with zero is found, then the channels is available and the pointer is set to that particular storage location.

At step 78, the search is started by activation of an actuator on the keypad, by the user. At step 80, a present frequency variable is set equal to a number corresponding to the lower limit frequency. Next, the PLL unit is loaded with the present frequency variable and the controller waits for the PLL LOCK signal to be received from the PLL unit. After the PLL LOCK signal is received, the controller checks for the presence of a signal at step 84 by checking the SQUELCH signal. If a signal is present, then the present frequency is known to be an active signal frequency and the controller proceeds to step 86. At step 86, the controller searches the channel memory for a number equal to the present frequency number. This operation is accomplished by reading the contents of each storage location, and comparing the contents with the present frequency number. If equality is found, then the present frequency is already stored in the channel memory and programming it into another storage location would be redundant. Alternatively, if no equality is found, then the controller proceeds to step 90 where the present frequency number is stored in the storage location pointed to by the channel memory pointer. Then, at step 92, the controller checks if the selected plurality of storage locations is full and if the user has interrupted the search sequence by pressing a stop actuator on the keypad. The channel memory is known to be full, in the preferred embodiment, when the channel memory pointer is at the highest channel number in the selected plurality of storage locations. If either of these two conditions is true, then the scanning and search sequence is stopped, and the controller displays "END" on the display.

Considering now step 84, if no signal is detected, then the present frequency is not an active signal channel and the controller increments the present frequency at step 98. Considering step 88, is the present frequency is found to already be programmed into the channel memory, the controller proceeds to step 98 and increments the present frequency. These are the two conditions in which the controller does not store the present frequency number into the selected plurality of storage locations. Alternatively, at step 92, since the present frequency was stored at step 90, and the memory is not full and the user has not stopped the scan and search sequence, control proceeds to step 96 wherein the channel memory pointer is incremented to the next available storage locations. The test for the next available storage locations is the same as was described earlier. The control then proceeds to step 98 where the present frequency number is incremented.

At step 100, the controller test to see if the present frequency number is greater than a number corresponding to the upper frequency limit entered at step 72. If this condition is false, control proceeds to step 82 and recirculates through the aforementioned steps, and sequences through all of the frequencies within the specified band. If, alternatively, at step 100, the condition is true, then the controller has scanned all of the frequencies in the specified band and the controller proceeds to step 80 where the present frequency number is set to the number corresponding to the lower limit frequency specified at step 72. The controller recirculates through the aforementioned steps and again scans the specified band of frequencies.

It should be noted that the sequential scanning and searching operation is repeated indefinitely until either the user interrupts the sequence or all of the selected plurality of storage locations are filled with numbers. In this way, the scanner will continue to search all the frequencies again and again, greatly improving the probability of finding frequencies which transmit intermittent signals, and are effectively active signal frequencies.

While the foregoing specification and drawings enable those skilled in this and related arts to practice the present invention in accordance with the preferred embodiment, the claimed invention encompasses a broader scope. Further modifications and improvements may occur which will make obvious manifold variants of the present invention. The claims appended hereunto are intended to read upon all such variants.

What is claimed is:

1. A method of searching for active signals which are intermittently transmitted and storing corresponding frequency numbers in storage locations in a memory in a scanning receiver, comprising the steps of:

specifying a first limit frequency;

specifying a second limit frequency;

specifying a plurality of channel memory storage locations;

sequentially reading each one of said plurality of channel memory storage locations and testing for an unused storage location, and, upon finding said unused storage location, setting a memory pointer thereto, and alternatively, upon not finding said unused storage location, terminating the searching and storing method;

enabling a frequency scan wherein each of a plurality of frequencies between said first limit frequency and said second limit frequency are sequentially received as a presently received frequency;

testing said presently received frequency for the presence of a signal;

upon detecting said signal on said presently received frequency, searching said plurality of channels memory storage locations for a number corresponding to said presently received frequency, and upon finding said number corresponding to said presently received frequency, continuing said frequency scan, and alternatively;

upon not finding said number corresponding to the presently received frequency, storing a number corresponding to said presently received frequency in said storage location pointed to by said memory pointer, and repeating said sequentially reading step wherein said plurality of memory storage locations are tested for said unused storage location.

2. A method of automatically searching for active signals and storing corresponding frequency numbers in storage locations in a memory in a scanning receiver, the scanning receiver having a controller, comprising the steps of:

specifying a plurality of frequencies;

testing the memory, by the controller, by searching a plurality of storage locations to find an unused storage location;

upon not finding an unused storage location, terminating the searching and storing method;

automatically searching, by the controller, for an active signal by scanning said plurality of frequencies to sequentially identify a presently received frequency and testing said presently received frequency for a signal, and upon finding said signal on said presently received frequency, storing a frequency number corresponding to said presently received frequency in said unused storage location, by the controller.

3. A method of automatically searching for active signals which are intermittently transmitted and storing corresponding frequency numbers in storage locations in a memory in a scanning receiver, comprising the steps of:

specifying a plurality of frequencies;

searching for an active signal by scanning said plurality of frequencies to sequentially identify a presently received frequency and testing said presently received frequency for a signal;

upon finding said signal on said presently received frequency, automatically searching a plurality of storage locations, by a controller, for an existing frequency number that corresponds to said presently received frequency, and upon not finding said existing frequency number that corresponds with said presently received frequency, storing a frequency number corresponding to said presently received frequency in a storage location.

4. A method of automatically searching for active signals which are intermittently transmitted and storing corresponding frequency numbers in storage locations in a memory in a scanning receiver, comprising the steps of:

specifying a plurality of frequencies;

specifying a plurality of storage locations;

automatically testing the memory, by a controller, by searching said plurality of storage locations to find an unused storage location;

upon not finding said unused storage location, terminating the searching and storing method;

alternatively, upon finding said unused storage location, searching for an active signal by scanning said plurality of frequencies to sequentially identify a presently received frequency and testing said presently received frequency for a signal;

upon finding said signal on said presently received frequency, automatically searching said plurality of storage locations, by the controller, for an existing frequency number that corresponds to said presently received frequency;

upon not finding said existing frequency number that corresponds with said presently received frequency, storing a frequency number corresponding to said presently received frequency in said unused storage location, and repeating said testing the memory step.

5. A method of automatically searching for active signals which are intermittently transmitted and storing corresponding frequency numbers in storage locations in a memory in a scanning receiver, the scanning receiver having a controller, comprising the steps of:

specifying an upper and lower limit frequency thereby defining a plurality of frequencies;

automatically testing the memory, by the controller, by sequentially reading each one of a plurality of storage locations and testing for an unused storage location;

upon not finding said unused storage location, terminating the searching and storing method;

alternatively, upon finding said unused storage location, automatically searching, by the controller, for an active signal by enabling a frequency scan wherein each of said plurality of frequencies is sequentially received as a presently received frequency and testing said presently received frequency for a signal;

upon finding said signal on said presently received frequency, storing a frequency number corresponding to said presently received frequency in said unused storage location, and repeating said testing the memory step.

6. A method of automatically searching for active signals which are intermittently transmitted and storing corresponding frequency numbers in storage locations in a memory in a scanning receiver, comprising the steps of:

specifying an upper and lower limit frequency thereby defining a plurality of frequencies;

specifying a plurality of storage locations;

automatically testing the memory, by a controller, by sequentially reading each one of said plurality of storage locations and testing for an unused storage location;

upon not finding said unused storage location, terminating the searching and storing method;

searching for an active signal by enabling a frequency scan wherein each of said plurality of frequencies is sequentially received as a presently received frequency and testing said presently received frequency for a signal;

upon finding said signal on said presently received frequency, automatically searching the memory, by the controller, for a storage location having an existing frequency number that corresponds to said presently received frequency;

upon not finding said existing frequency that corresponds with said presently received frequency storing a frequency number corresponding to said presently received frequency in said unused storage location, and repeating said testing the memory step.

7. A scanning receiver which receives intermittently transmitted signals comprising:

a memory having a plurality of storage locations for storing frequencies numbers which correspond to frequencies;

a receiver operable to receive signals on frequencies in accordance with frequency numbers and said receiver having an output operable to indicate the presence of active signals;

a controller coupled to said memory and operable to store frequency numbers therein, said controller operably coupled to said receiver for controlling the frequency of operation thereof in accordance with frequency numbers, said controller operable to cause said receiver to sequentially scan a plurality of frequencies, and said controller further coupled to said output of said receiver for detecting the presence of an active signal on a presently received frequency;

a first actuator coupled to said controller and operable to select said plurality of frequencies;

a second actuator coupled to said controller and operable to select a portion of said plurality of storage locations, and wherein actuation of said first and second actuators causes said controller to initiate a repetitive scan of said plurality of frequencies, each of said plurality of frequencies being sequentially received as said presently received frequency, and, wherein detection of each presently received frequency having said active signal thereon causes said controller to search said plurality of storage locations for an unused storage location and store a frequency number corresponding to said presently received frequency and if said unused storage location is not found, said controller terminates said repetitive scan.

8. The scanning receiver of claim 7, and wherein:

upon detection of said active signal on said presently received frequency, said controller searches said plurality of storage locations for an existing frequency number equal to a frequency number corresponding to said presently received frequency and if said existing frequency number is found, said frequency number corresponding to said presently received frequency in not stored in said memory.

* * * * *